(12) United States Patent
Manger et al.

(10) Patent No.: US 7,737,049 B2
(45) Date of Patent: Jun. 15, 2010

(54) METHOD FOR FORMING A STRUCTURE ON A SUBSTRATE AND DEVICE

(75) Inventors: Dirk Manger, Dresden (DE); Stephan Wege, Dresden (DE); Rolf Weis, Dresden (DE); Christoph Noelscher, Nuremberg (DE)

(73) Assignee: Qimonda AG, Munich (DE)

( * ) Notice: Subject to any disclaimer, the term of this patent is extended or adjusted under 35 U.S.C. 154(b) by 108 days.

(21) Appl. No.: 11/831,504

(22) Filed: Jul. 31, 2007

(65) Prior Publication Data

US 2009/0033362 A1   Feb. 5, 2009

(51) Int. Cl.
H01R 43/00 (2006.01)
H01L 21/02 (2006.01)
H01L 21/31 (2006.01)

(52) U.S. Cl. .............. 438/763; 438/7; 438/5; 438/10; 257/E21.259; 257/E21.268; 257/E21.27; 362/52

(58) Field of Classification Search .......... 438/706, 438/710, 714, 723, 724, 725, 736; 216/62, 216/67, 74, 80
See application file for complete search history.

(56) References Cited

U.S. PATENT DOCUMENTS

| | | | |
|---|---|---|---|
| 4,233,337 A | 11/1980 | Friedman et al. | |
| 4,514,251 A | 4/1985 | van Ommen et al. | |
| 5,254,503 A | 10/1993 | Kenney | |
| 5,395,797 A | 3/1995 | Chen et al. | |
| 5,538,592 A | 7/1996 | Chen et al. | |
| 5,621,233 A | 4/1997 | Sharma et al. | |
| 5,665,622 A | 9/1997 | Muller et al. | |
| 5,714,411 A | 2/1998 | Trahan et al. | |
| 5,753,417 A | 5/1998 | Ulrich | |
| 6,096,618 A | 8/2000 | Dunn et al. | |
| 6,192,290 B1 | 2/2001 | Adams | |
| 6,287,937 B1* | 9/2001 | Lee et al. | 438/424 |
| 6,362,058 B1 | 3/2002 | Houston | |
| 6,362,117 B1 | 3/2002 | Houston | |
| 6,413,683 B1 | 7/2002 | Liebmann et al. | |
| 6,518,151 B1* | 2/2003 | Dobuzinsky et al. | 438/551 |
| 6,677,168 B1* | 1/2004 | Zhao et al. | 438/14 |
| 6,750,494 B1 | 6/2004 | Prall | |
| 6,759,180 B2 | 7/2004 | Lee | |
| 6,797,610 B1 | 9/2004 | Gambino et al. | |
| 6,897,517 B2 | 5/2005 | Van Houdt et al. | |
| 6,987,051 B2 | 1/2006 | Schwarzenbach et al. | |
| 7,250,336 B2 | 7/2007 | Regul et al. | |
| 2001/0055221 A1 | 12/2001 | Noble | |
| 2003/0141559 A1* | 7/2003 | Moscatelli et al. | 257/406 |
| 2003/0203636 A1 | 10/2003 | Anthony | |
| 2004/0002203 A1 | 1/2004 | Deshpande et al. | |

(Continued)

FOREIGN PATENT DOCUMENTS

DE   1 43 673   9/1980

(Continued)

*Primary Examiner*—Allan Olsen
(74) *Attorney, Agent, or Firm*—Slater & Matsil, L.L.P.

(57) ABSTRACT

In one aspect, a method of forming a structure on a substrate is disclosed. For example, the method includes forming a first mask layer and a second mask layer, modifying a material property in regions of the first and second mask layers, and forming the structure based on the modified regions.

23 Claims, 23 Drawing Sheets

U.S. PATENT DOCUMENTS

| | | |
|---|---|---|
| 2004/0008747 A1 | 1/2004 | Nakayama et al. |
| 2005/0003653 A1* | 1/2005 | Kanamura .................. 438/622 |
| 2005/0010878 A1 | 1/2005 | Blatchford, Jr. et al. |
| 2005/0024933 A1 | 2/2005 | Pellizzer et al. |
| 2005/0167394 A1 | 8/2005 | Liu et al. |
| 2005/0167838 A1 | 8/2005 | Edelstein et al. |
| 2006/0057757 A1* | 3/2006 | Park et al. ...................... 438/50 |
| 2006/0073652 A1 | 4/2006 | Pellizzer et al. |
| 2006/0169968 A1 | 8/2006 | Happ |
| 2006/0228895 A1 | 10/2006 | Chae et al. |
| 2008/0070373 A1* | 3/2008 | Huang ........................ 438/386 |

FOREIGN PATENT DOCUMENTS

| | | |
|---|---|---|
| DE | 222 450 A1 | 5/1985 |
| DE | 41 03 594 A1 | 3/1992 |
| DE | 10 2004 019 862 A1 | 11/2005 |
| DE | 10 2004 029 516 B3 | 12/2005 |
| EP | 0 005 185 | 11/1979 |
| EP | 0 122 662 B1 | 9/1987 |
| EP | 0 696 052 A2 | 2/1996 |
| EP | 0 959 501 A2 | 11/1999 |
| EP | 1 357 433 A2 | 10/2003 |
| EP | 1 475 840 A1 | 11/2004 |
| GB | 2 247 780 A | 3/1992 |
| JP | 6-333795 | 12/1994 |
| JP | 7-86287 | 3/1995 |
| JP | 7-106227 A | 4/1995 |
| JP | 9-283413 A | 10/1997 |
| JP | 10-303157 A | 11/1998 |
| JP | 2001-147113 A | 5/2001 |
| JP | 2002-55434 A | 2/2002 |
| JP | 2002-204148 A | 7/2002 |
| JP | 2003-195512 A | 7/2003 |
| JP | 2003-289039 A | 10/2003 |
| JP | 2004-87562 A | 3/2004 |
| JP | 2005-24687 | 1/2005 |
| JP | 2005-93683 | 4/2005 |
| KR | 2004-0095883 | 11/2004 |

* cited by examiner

FIG 12 (A-A)
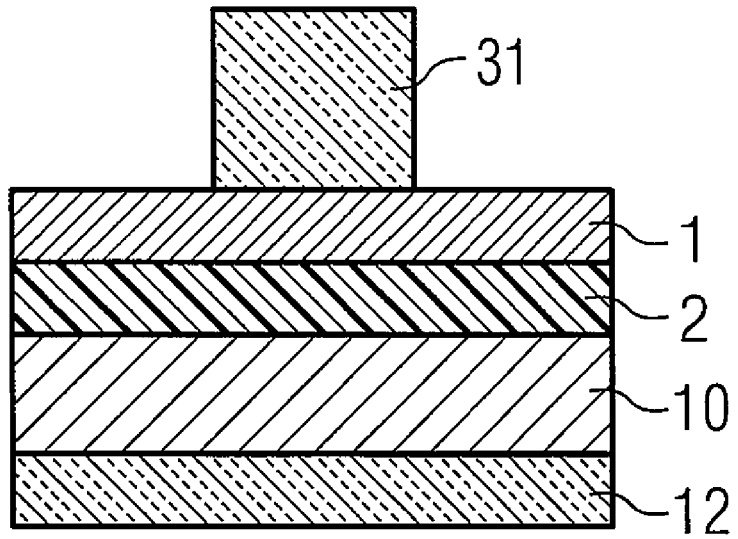
FIG 12A
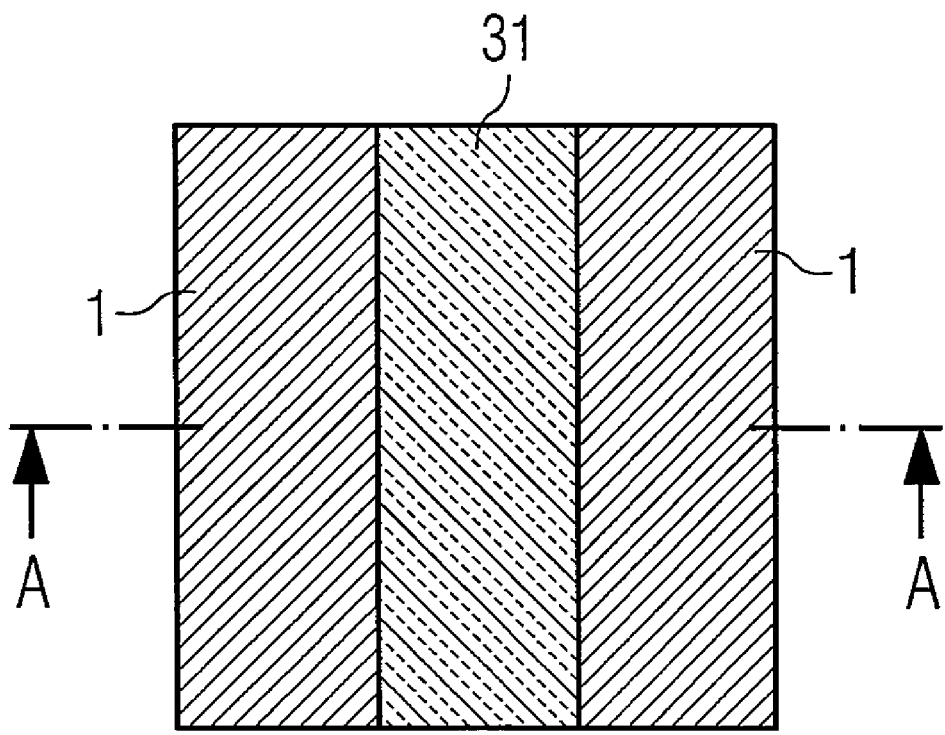

FIG 13 (B-B)
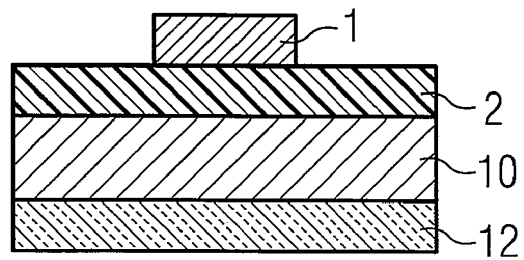
FIG 13A
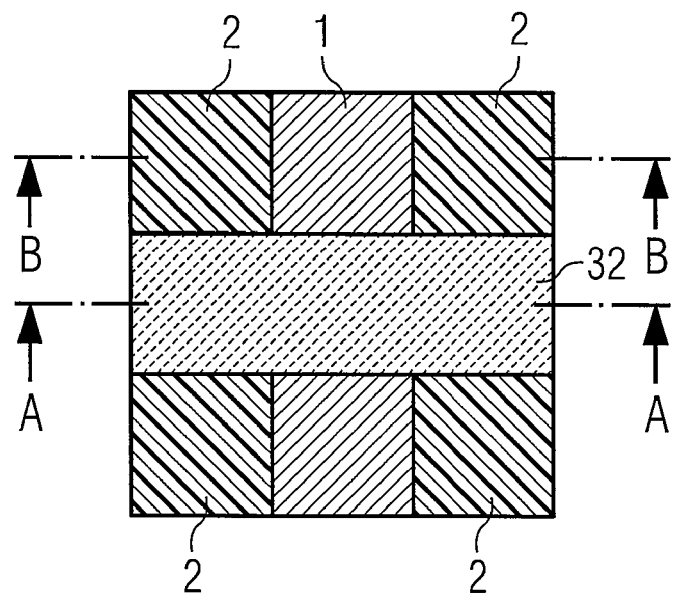
FIG 13B (A-A)
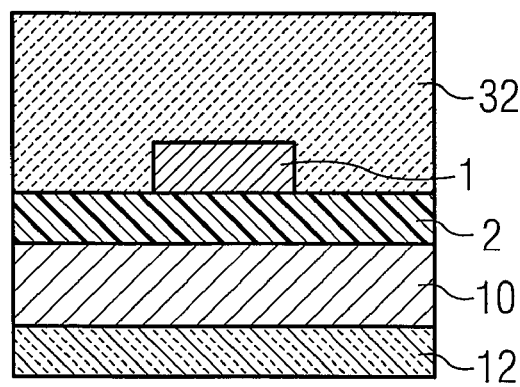

FIG 14 (A-A)
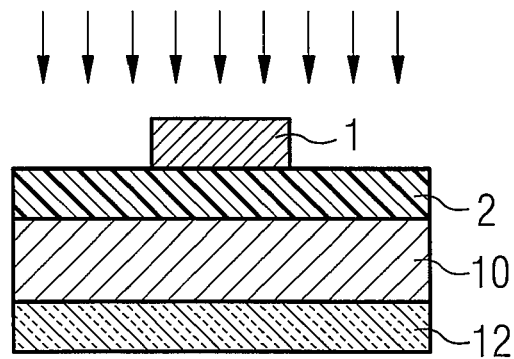
FIG 14A
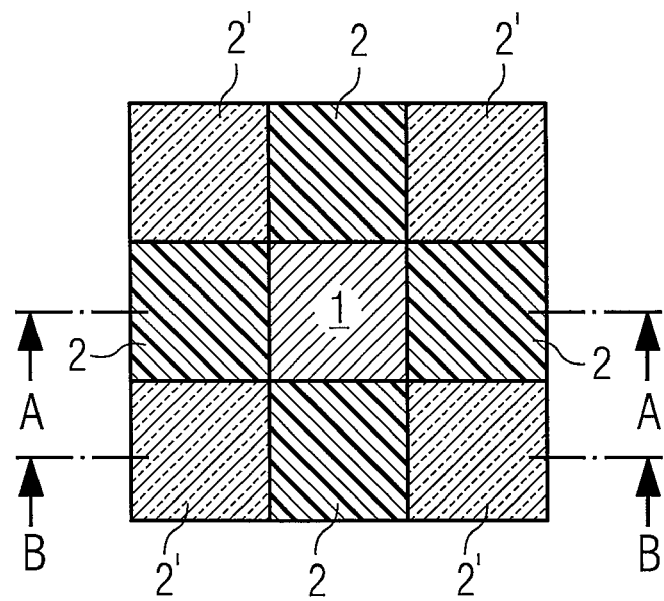
FIG 14B (B-B)
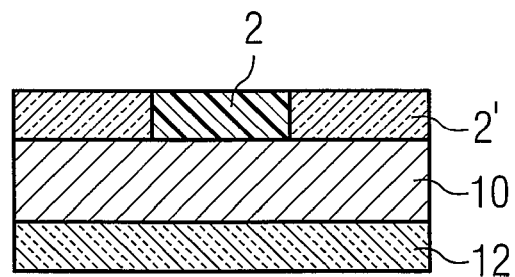

FIG 15 (A-A)
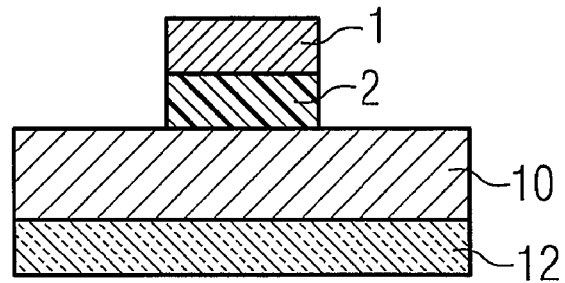
FIG 15A
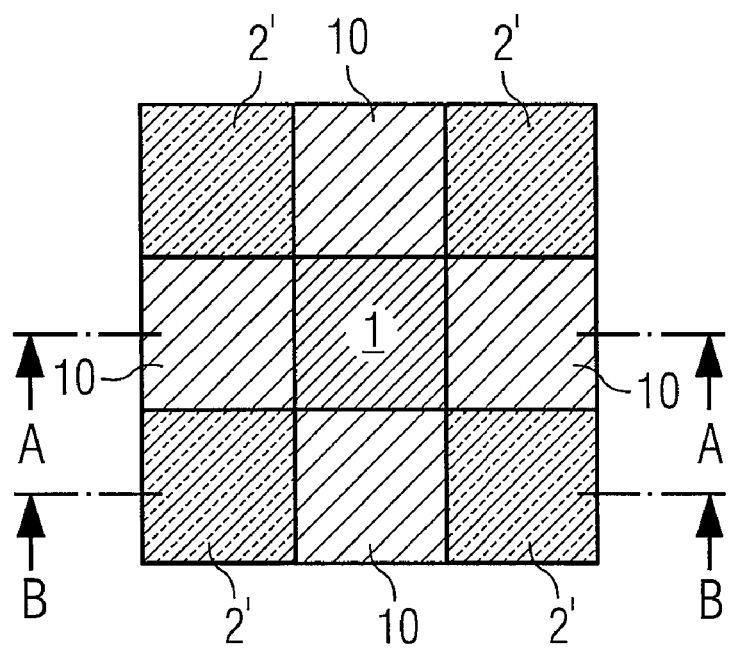
FIG 15B (B-B)
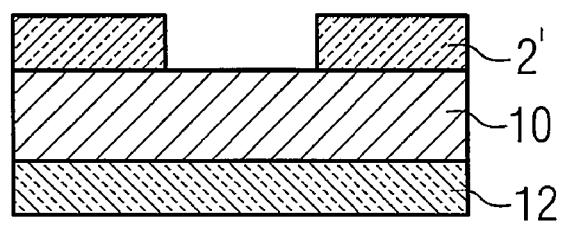

FIG 16 (A-A)
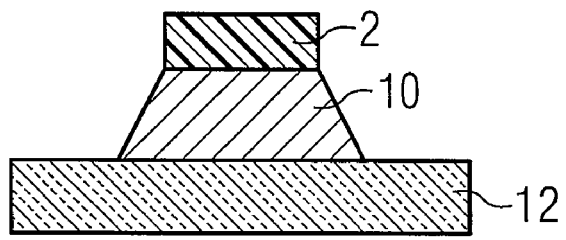
FIG 16A
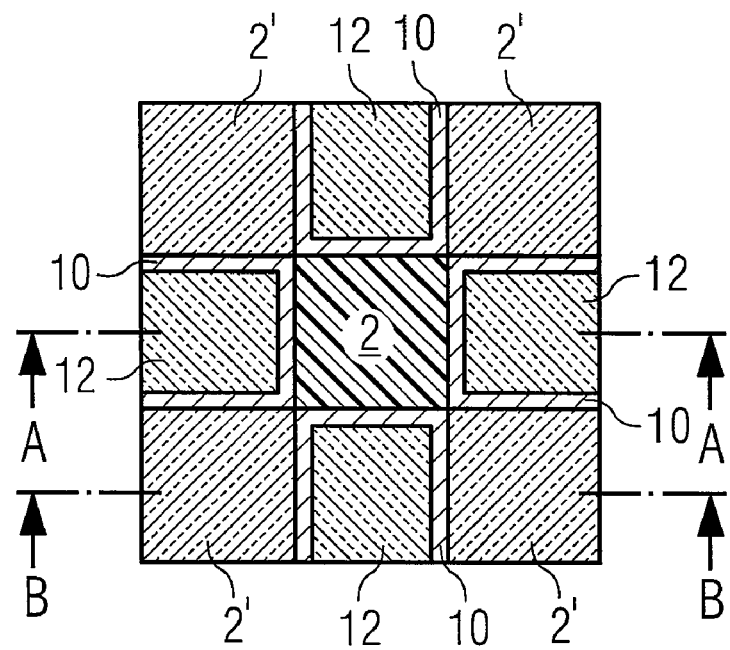
FIG 16B (B-B)
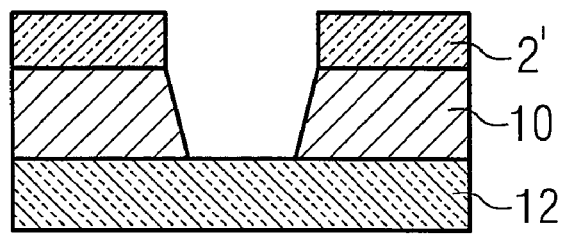

FIG 17 (A-A)
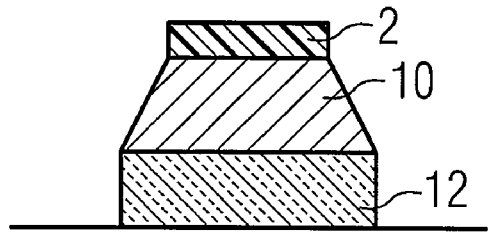
FIG 17A
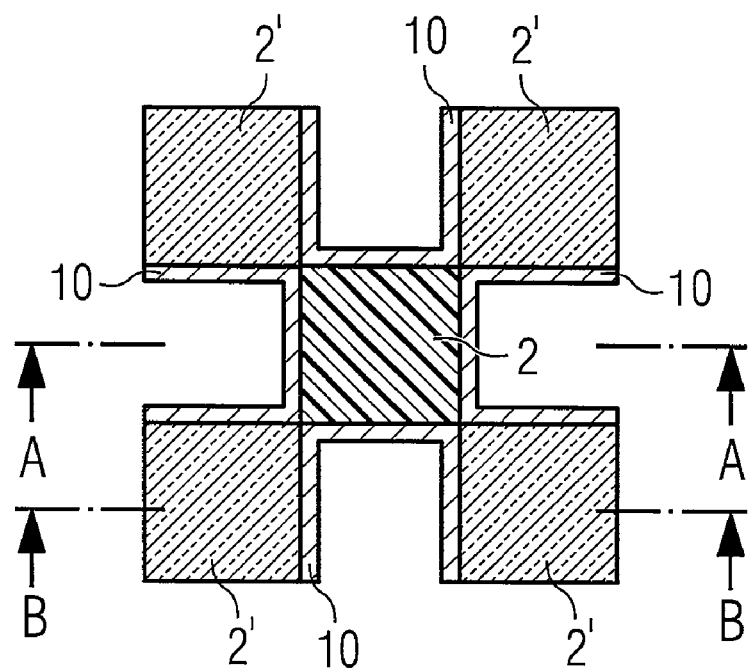
FIG 17B (B-B)
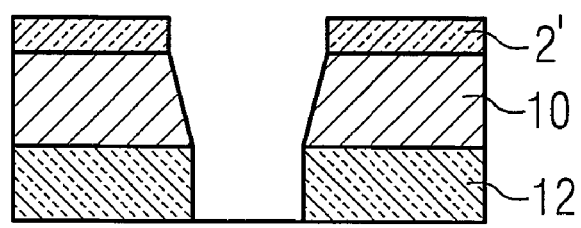

FIG 18 (A-A)
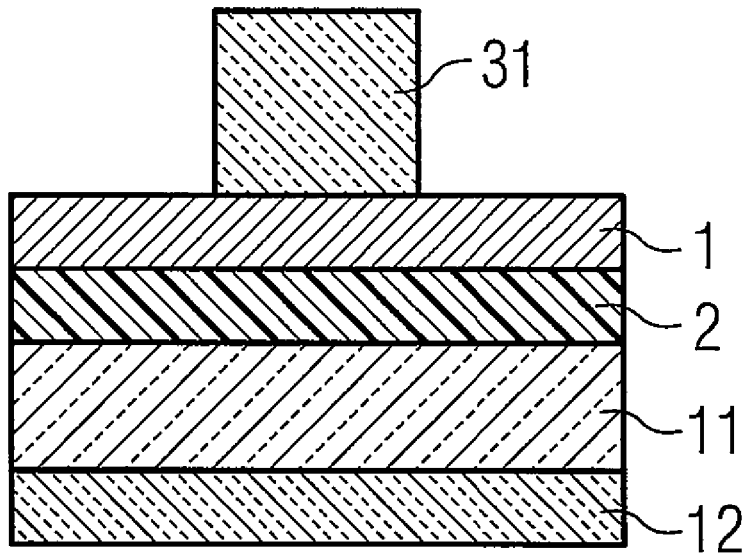
FIG 18A
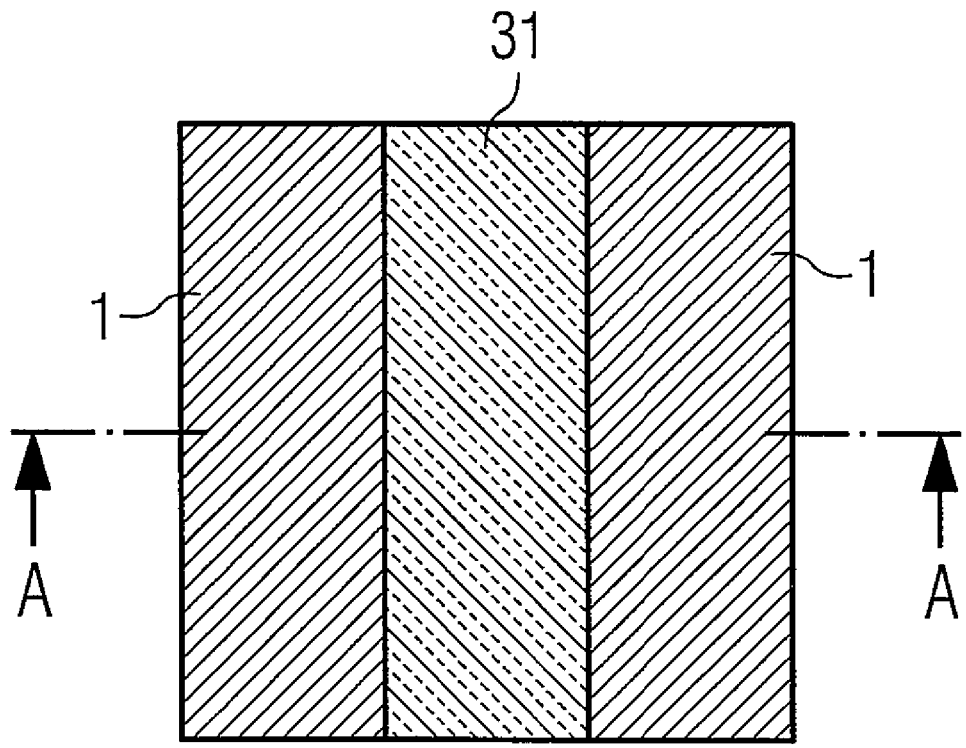

FIG 19 (B-B)
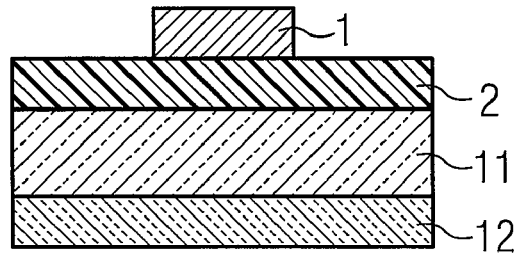
FIG 19A
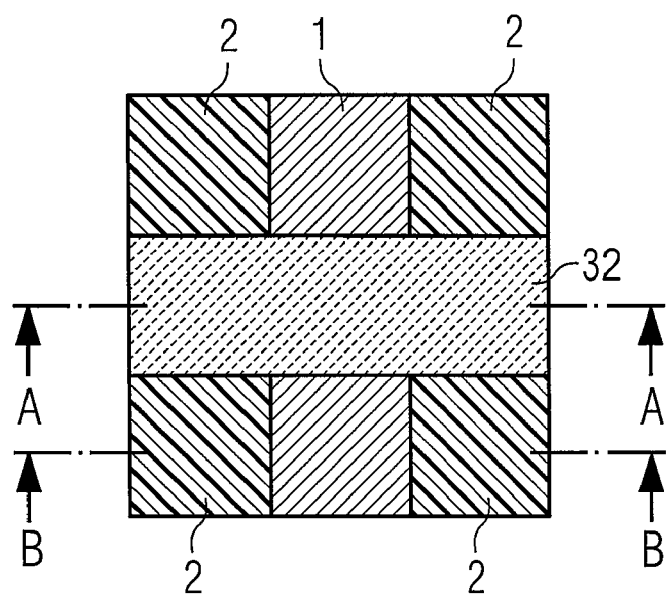
FIG 19B (A-A)
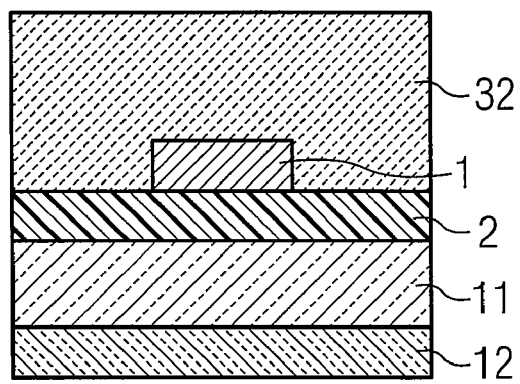

FIG 20 (A-A)
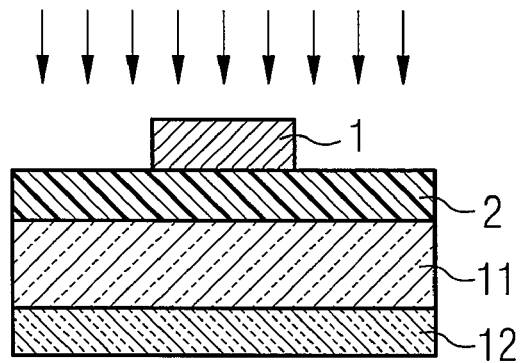
FIG 20A
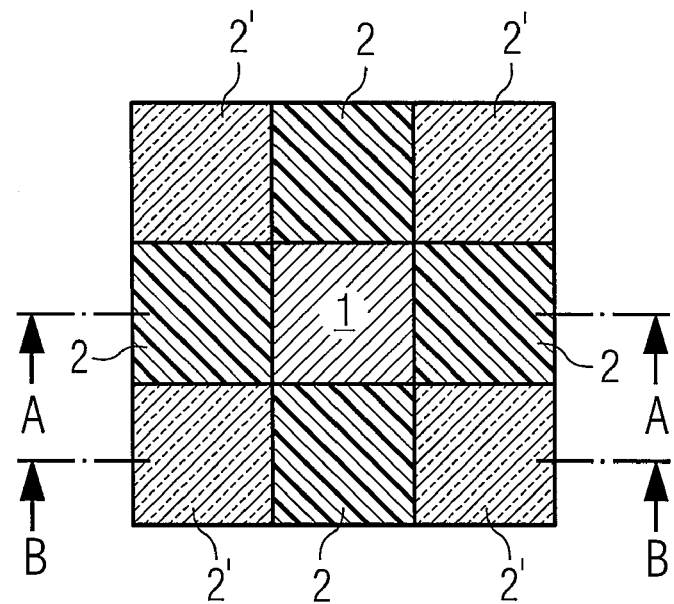
FIG 20B (B-B)
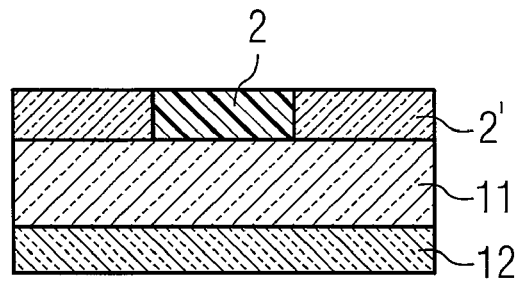

FIG 21 (A-A)
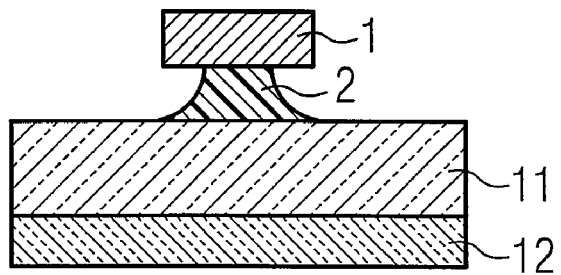
FIG 21A
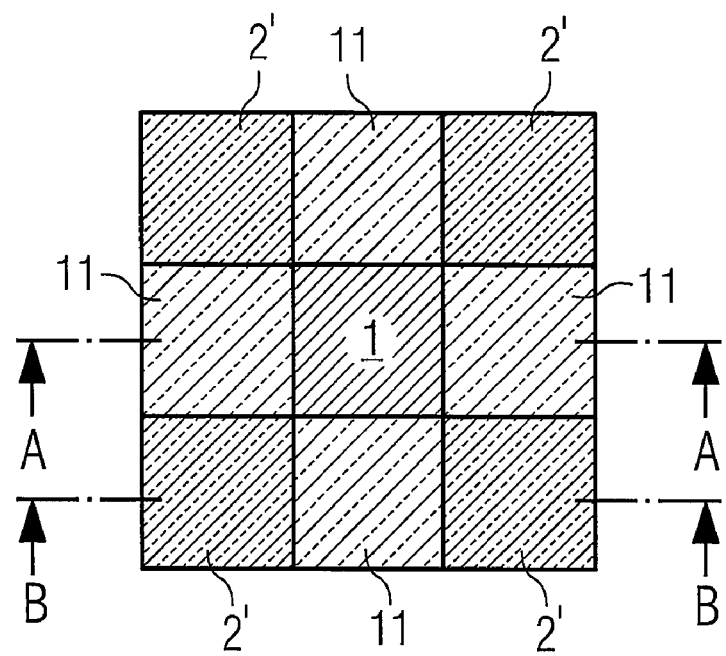
FIG 21B (B-B)
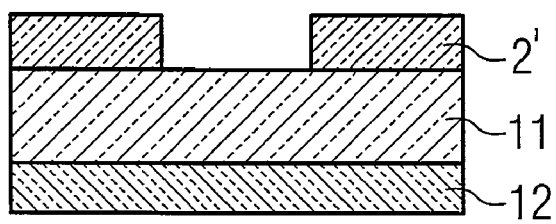

FIG 22 (A-A)
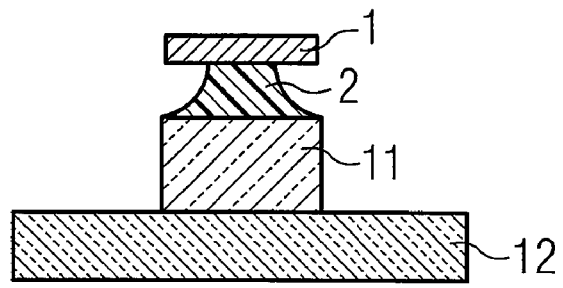
FIG 22A
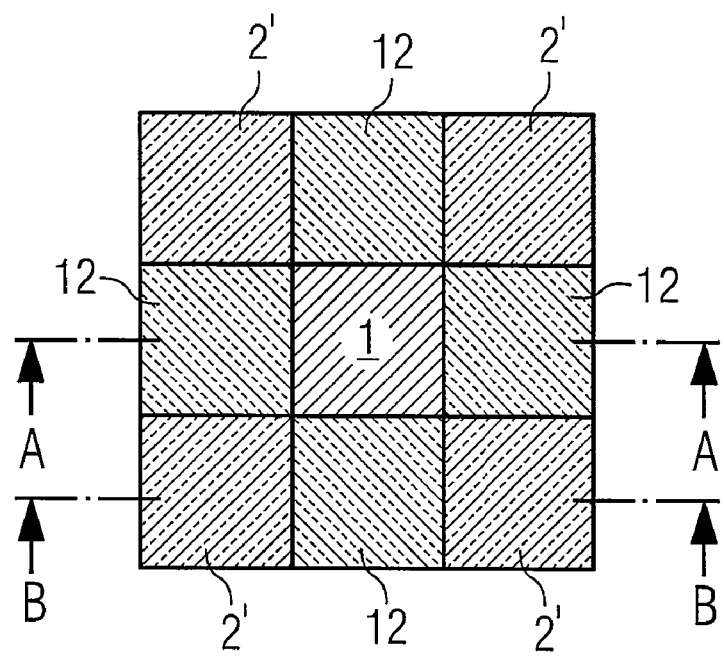
FIG 22B (B-B)
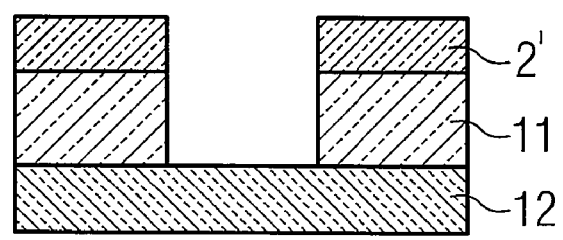

FIG 23 (A-A)
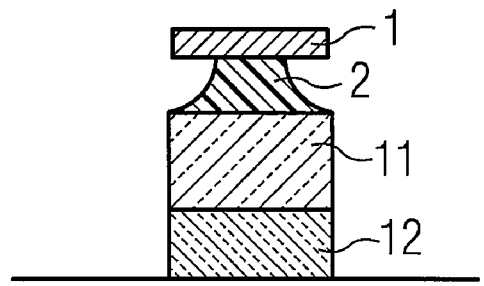
FIG 23A
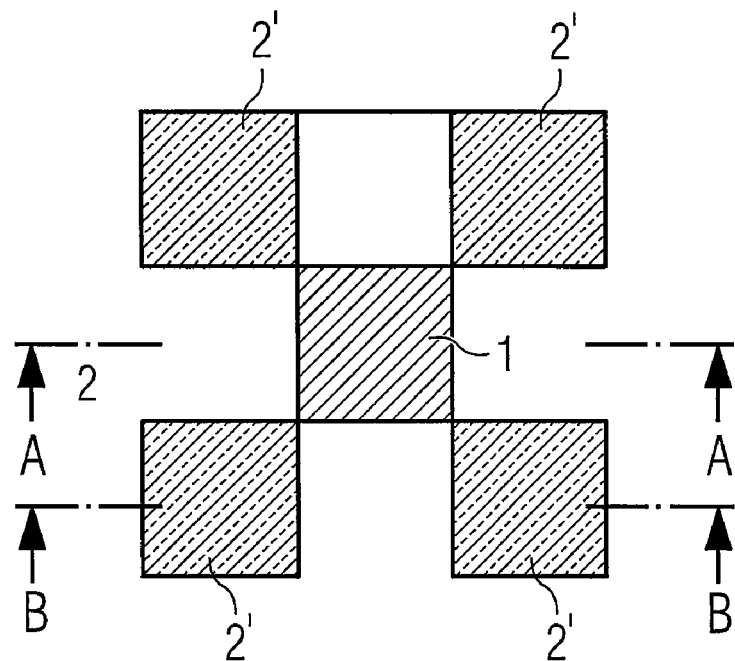
FIG 23B (B-B)
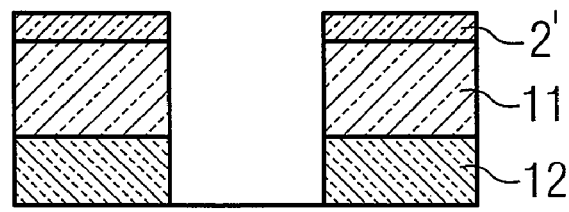

FIG 24 (A-A)
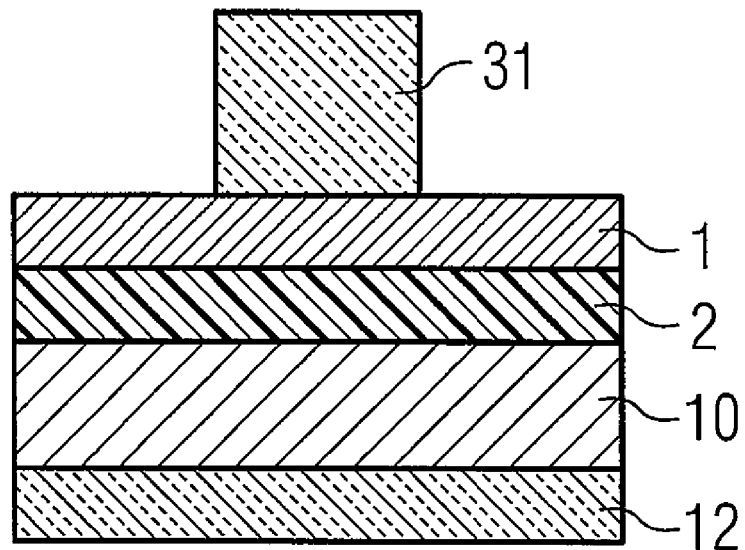
FIG 24A
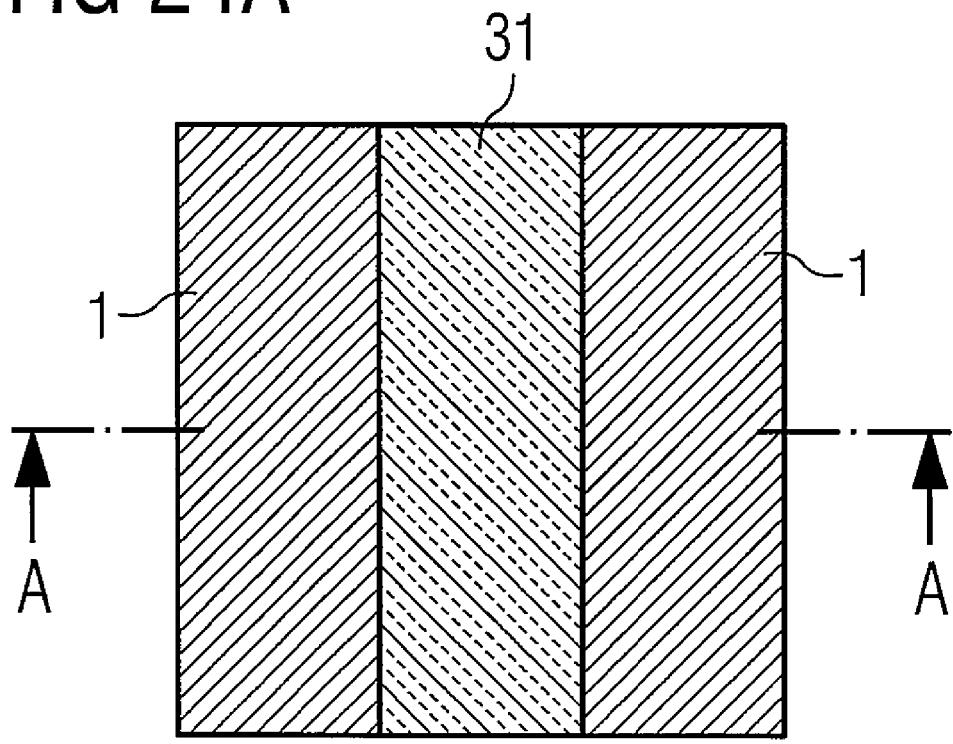

FIG 25 (B-B)
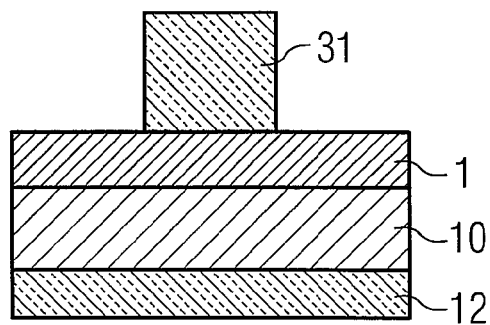
FIG 25A
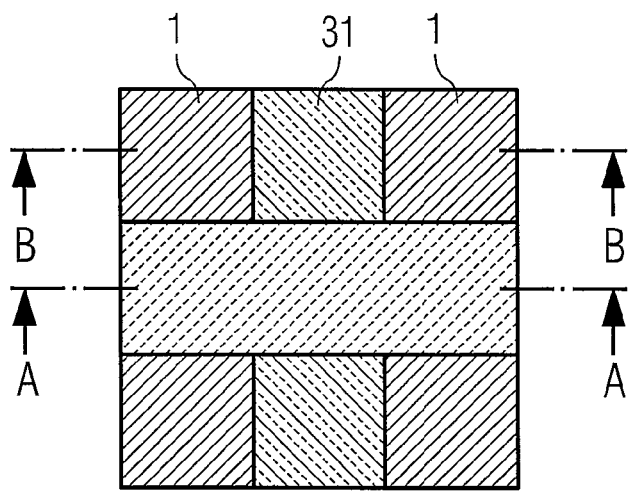
FIG 25B (A-A)
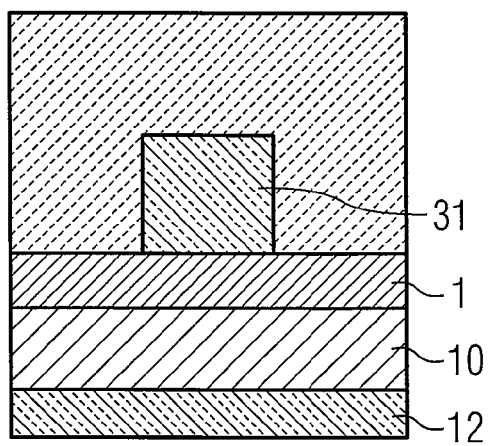

FIG 26 (B-B)
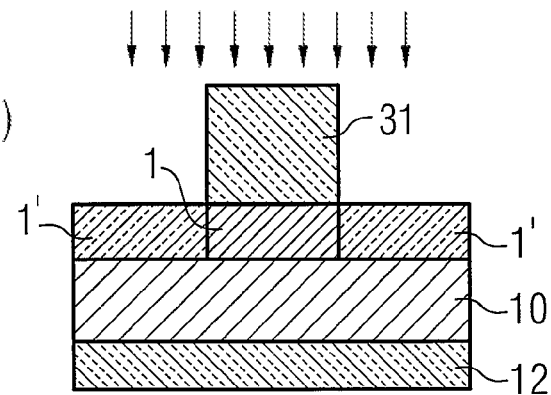
FIG 26A
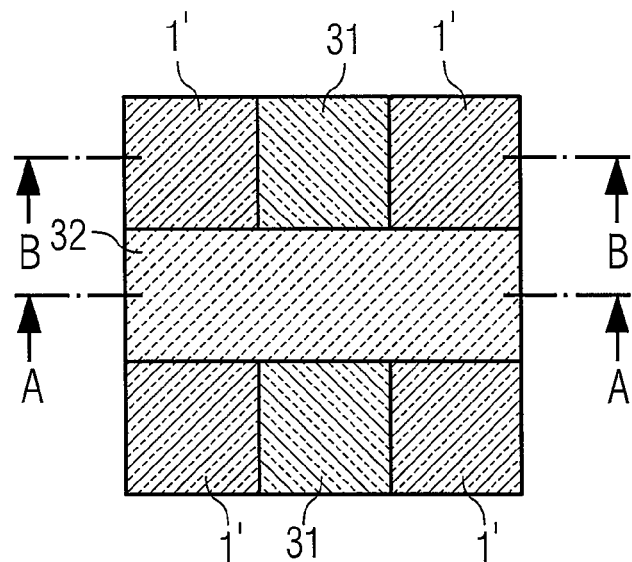
FIG 26B (A-A)
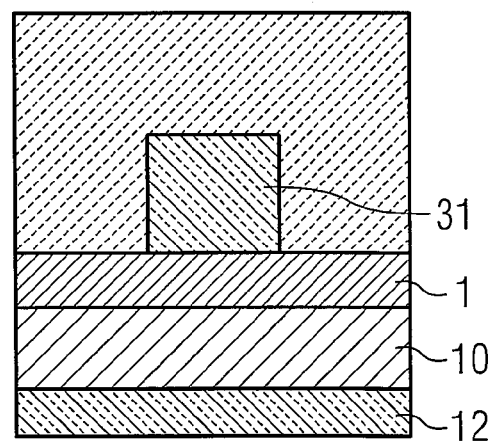

FIG 27 (B-B)
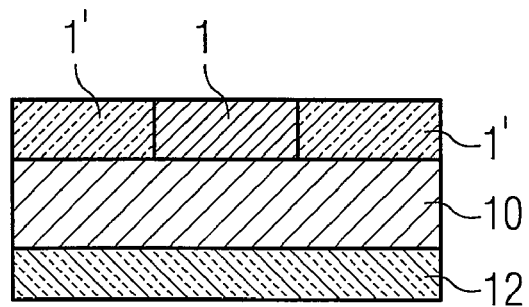
FIG 27A
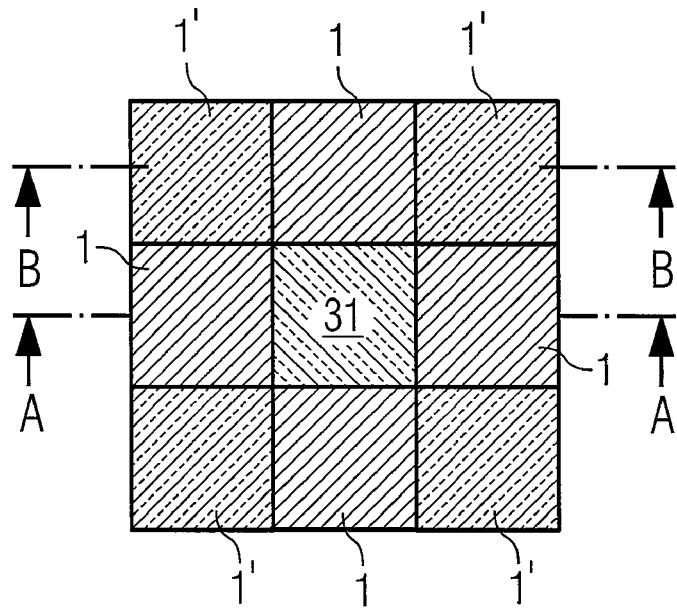
FIG 27B (A-A)
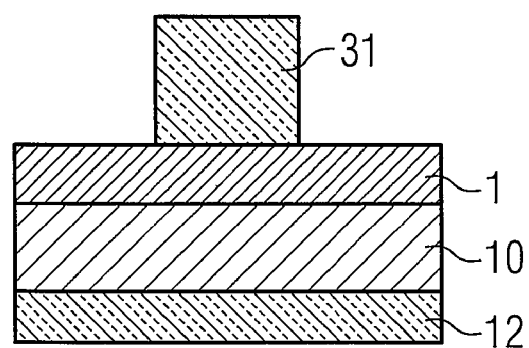

FIG 28 (A-A)
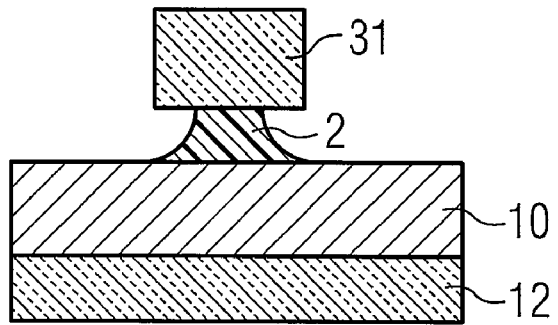
FIG 28A
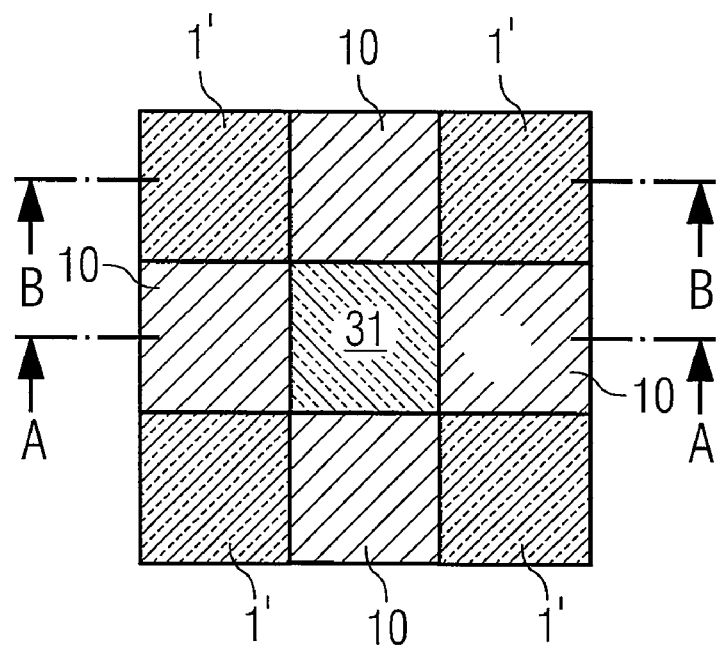
FIG 28B (B-B)
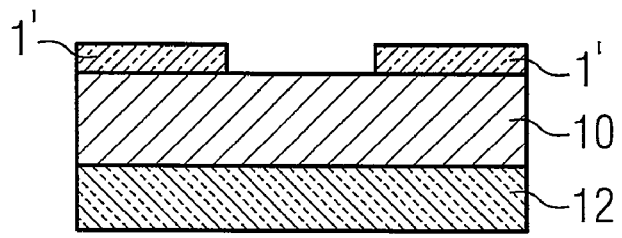

FIG 29 (B-B)
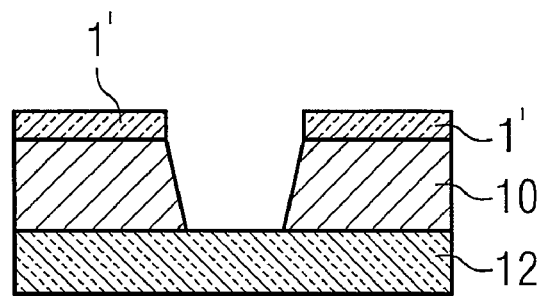
FIG 29A
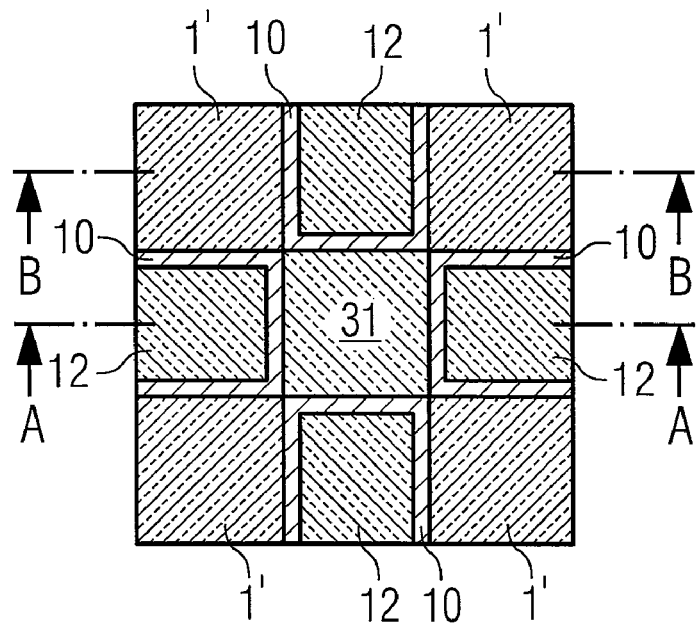
FIG 29B (A-A)
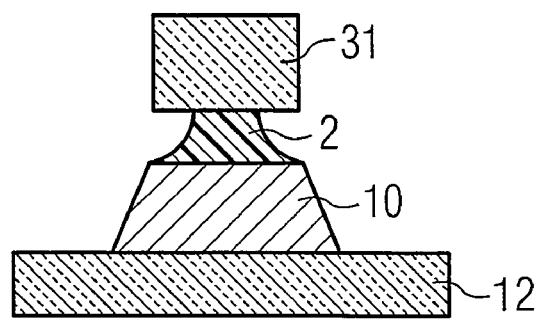

METHOD FOR FORMING A STRUCTURE ON A SUBSTRATE AND DEVICE

BACKGROUND

In the manufacturing of devices it is necessary to produce structures in or on a substrate that will provide a wide range of functionalities.

BRIEF DESCRIPTION OF THE DRAWINGS

For a more complete understanding of the present invention, and the advantages thereof, reference is now made to the following descriptions taken in conjunction with the accompanying drawing, in which:

FIGS. 12-17 illustrate that additional embodiment of the invention;

FIGS. 18-23 illustrate an additional embodiment of the invention; and

FIGS. 24-29 illustrate an additional embodiment of the invention.

DETAILED DESCRIPTION OF ILLUSTRATIVE EMBODIMENTS

Depending on the nature of a device to be manufactured, the substrate can, e.g., comprise at least one semiconductor material, silicon, germanium, III-V semiconductor material, plastic and glass.

By the way of example, the substrate in the following is taken to be a semiconductor material like, e.g., silicon. Such a material could be used in the manufacturing of a semiconductor device.

FIGS. 1, 2, 3, 4, 5, 6, 7 and 8 describe schematically cross sections of the substrate 10 with various layers on top of the substrate 10. A substrate means some layer or wafer that is structured by the method as will be described below (see FIGS. 8, 8A).

FIGS. 1A, 2A, 3A, 4A, 5A, 6A, 7A and 8A describe the corresponding top views of the cross sections of FIGS. 1 to 8. In the top views the sectional line A-A of the cross sectional views of FIGS. 1 to 8 is depicted.

As will be clear to the person skilled in the art, the figures show schematically only a part of a structure used in the manufacturing of a semiconductor device. Other parts of the semiconductor device might have the same pattern depicted here or might have different patterns. Furthermore, the patterns depicted below might be present in an intermediate state in the manufacturing of a semiconductor device or might be discernable in the final product.

The method described in connection with one embodiment can be applied in the manufacturing of semiconductor devices in general. Examples for such semiconductor devices are memory chips like DRAM-chips or Flash-chips. Other examples of semiconductor devices are microprocessors, microelectromechanical devices or optoelectronic devices.

Another application of the method can be the structuring of a substrate 10 used micro-biological systems, like micro reactors or DNA chips.

Figure 1:
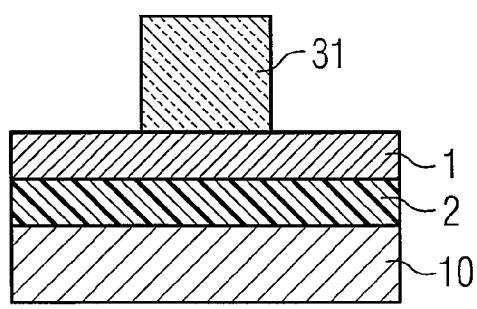
In FIGS. 1 to 8A, an embodiment of the method is described in connection with a two-layer hard mask system 1, 2 on a substrate 10. The materials used in this embodiment are exemplary and are not limiting the scope of the invention.
Figure 1A:
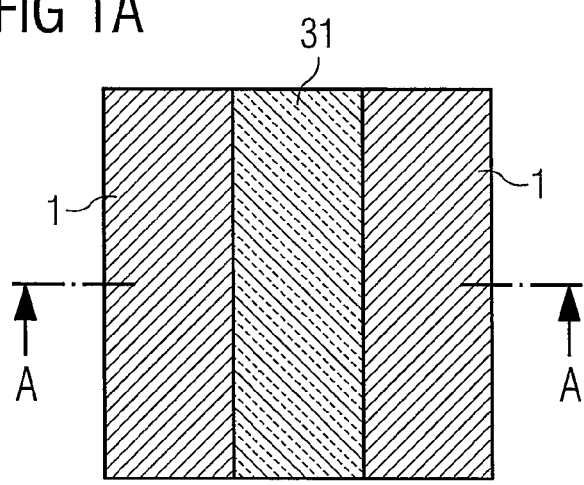

In FIGS. 1, 1A, a starting point for the embodiment of the method is shown. A first hard mask layer 1 and a second hard mask layer 2 are positioned above the substrate 10. In other embodiments, more than these hard mask layers 1, 2 can be used.

The substrate 10 in this embodiment is a $SiO_2$ layer or a SiN layer. The substrate 10 could be a layer made of a different material, be it unstructured or structured. It is also possible that the substrate 10 is a silicon wafer or a germanium wafer to be structured by the method.

In an embodiment analogue to FIGS. 1, 1A, the first hard mask layer 1 is a 20 nm thick layer of non-implanted $Al_2O_3$. The first hard mask layer 1 in this embodiment is deposited by a PVD method, in which the $Al_2O_3$ crystallizes at a low temperature. The embodiment used as an example here, uses a first hard mask layer 1 that is resistant to a standard clean etch (SC1) and can be made susceptible to an attack by standard clean etch by ion implantation. A standard clean 1 etch uses ammonia hydroxide, hydrogenperoxides and deionzied water.

The second hard mask layer 2 is a 20 nm thick layer of non-doped poly-silicon (the second hard mask layer 2 is not visible in the top view of FIG. 1A). In this embodiment the second hard mask layer 2 is deposited by using a CVD, LPCVD or PVD method. The second hard mask layer 2 is amorphous in this case and might be alloyed with germanium or a different material.

The materials of the first and second hard mask layers 1, 2 are just examples. The person skilled in the art will recognize that other materials might be used as well, such as $Al_2O_3$, SiON, $SiO_2$, silicon, poly-silicon, amorphous silicon or carbon.

Figure 2:
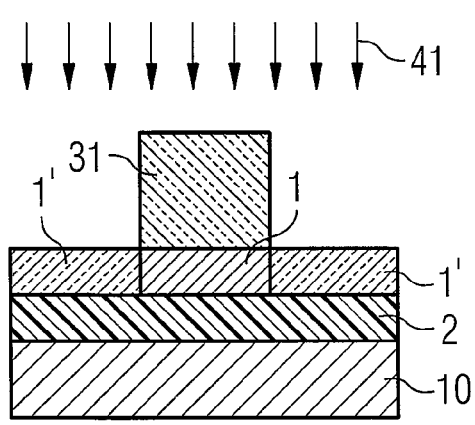
Figure 5:
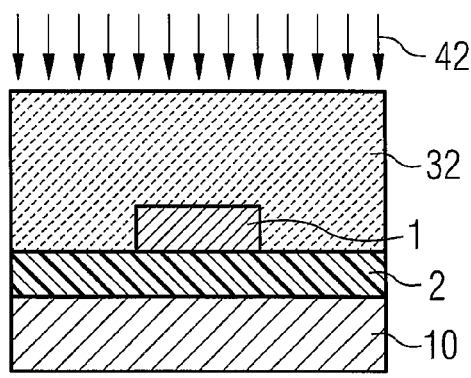

It is possible to introduce an intermediate layer 3 between the first hard mask layer 1 and the second hard mask layer 2 that will suppress the straggling of ions after ion implantations (see FIGS. 2 and 5). This embodiment will be described in connection with FIG. 11.

The person skilled in the art will recognize that the thickness of the hard mask layers 1, 2 can vary substantially depending on the manufacturing situation and the chosen materials for the hard mask layers 1, 2. Furthermore the hard mask layers 1, 2 do not have to have the same thickness. By way of example, the thickness of the hard mask layers 1, 2 can be between 0.5 to 100 nm. In particular, possible embodiments of hard mask layers 1, 2 have thicknesses of 15 nm, 15 to 20 nm, 10 to 20 nm, 2 to 20 nm, 0.5 to 20 nm, 10 to 25 nm, 5 to 25 nm, 5 to 35 nm, 5 to 50 nm and 5 to 100 nm.

On top of the first hard mask layer 1, a first resist layer 31 is positioned that in the example of FIGS. 1, 1A has already been structured into a line (see FIG. 1A).

Figure 2A:
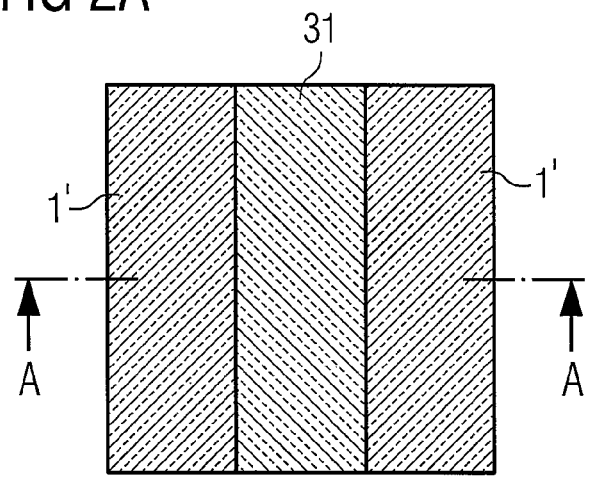

In FIGS. 2, 2A, the stack shown in FIGS. 1, 1A is subjected to a vertical first ion implantation 41 by argon, xenon, fluorine or hydrogen ions. The first hard mask layer 1 and the resist 31 become implanted with the implantation species. For the further processing in this embodiment, it is noteworthy that the first hard mask layer 1 now comprises an implanted part 1' in the region in which it is not covered by resist 31 and an non-implanted part 1 in which the first hard mask layer 1 is covered by resist 31. In this description, the implanted regions are generally indicated by a primed numeral.

Figure 3:
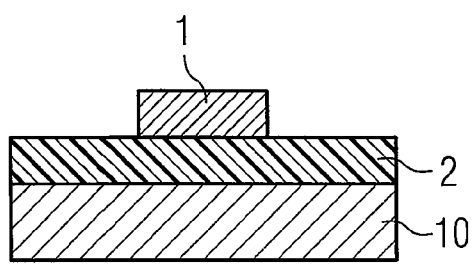
Figure 3A:
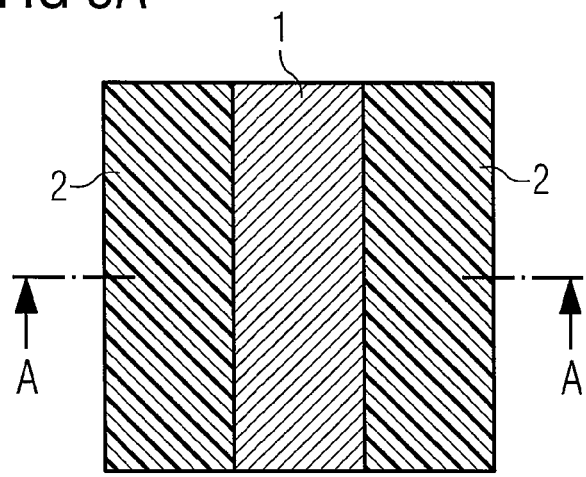

In FIGS. 3, 3A, the stack shown in FIGS. 2, 2A was subjected to a stripping of the resist 31 and the implanted part 1' of the first hard mask layer 1. The stripping can be performed with a hot standard clean 1 which is selective to the second hard mask layer 2 of poly-silicon. After the removal, a line of the first hard mask layer 1 is positioned on the second hard mask layer 2 as can best be seen in FIG. 3A.

The person skilled in the art will recognize that the etching and the removal of the first resist 31 in this embodiment is exemplary and that other etching or stripping methods can be used or have to be used in case other materials are chosen. Furthermore, the line pattern produced in the first hard mask layer 1 is chosen here by the way of an example. Other especially more complex structures are possible.

Figure 4:
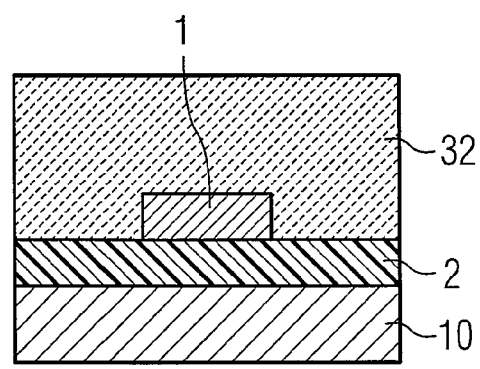
Figure 4A:
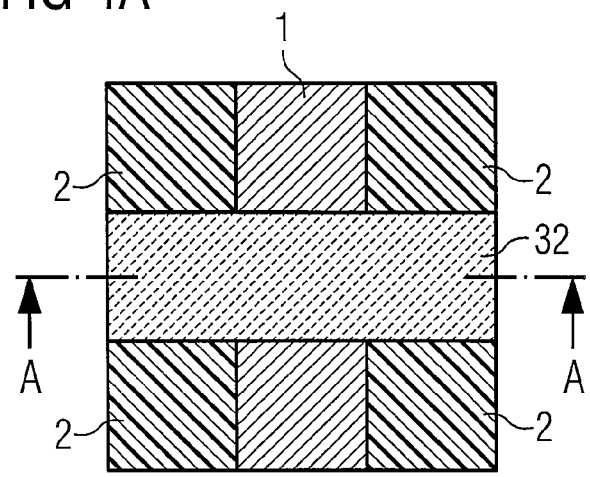

In FIGS. 4, 4A, the stack shown in FIGS. 3, 3A is covered with a second resist 32 which is then structured. The structured second resist 32 can best be seen in the top view of FIG. 4A. The second resist 32 is in this embodiment structured so that it forms a line which is orthogonal to the first hard mask layer 1 forming a line in it self. From FIG. 4A it can be seen that to the sides of the line formed by the second resist 32 and the first hard mask layer 1 are not covered by the second resist.

As in the case of the line in the first hard mask layer 1, the line pattern in the structured second resist 32 is chosen by way of example. Other embodiments might use a more complex structure in the second resist 32 or a line which is not orthogonal to a line structure underneath.

Figure 5A:
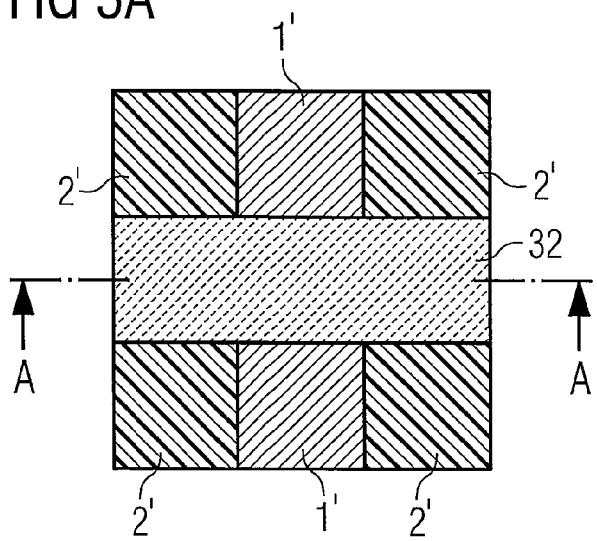

In FIGS. 5, 5A, the stack shown in FIGS. 4, 4A is vertically subjected to a second vertical ion implantation 42 of a high dose of implants. B, $BF_3$, O and As are possible implant species. Depending on the choice of implant species, the etching chemistry changes. If B, $BF_3$ or As are used, implanted $Al_2O_3$ is removed by a standard clean 1 etch. Non-implanted a-Si is, e.g., removed with $NH_4OH$. If O is used as an implant species, implanted $Al_2O_3$ can be removed with, e.g., a standard clean 1 etch. The amorphous silicon that is not implanted with O can, e.g., be removed with a highly selective chemistry such as, e.g., HBr, HE, $O_2$ or $SF_6$.

The second implantation modifies the etch selectivities of the two hard mask layers 1, 2 of the stack (i.e., modifying the structuring possibilities of the top layer in subsequent process steps), producing fields with four different states. The states are here defined by the different etch selectivities as material property.

The person skilled in the art will recognize, that the etch selectivity is chosen here, by way of example, for a material property in general. Further, as described below, other embodiments of the method use material properties other than etch selectivities.

Figure 6:
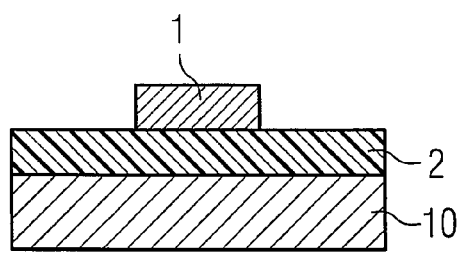
Figure 6A:
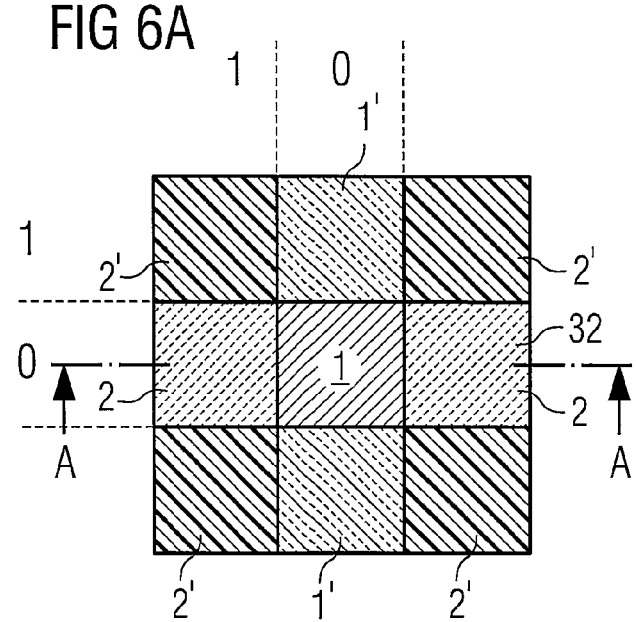

In FIGS. 6, 6A, the stack of FIGS. 5, 5A is shown with the second resist 32 removed.

As can be seen best in FIG. 6A, the pattern comprises regular by positioned fields with four different etch selectivities.

In the middle, a square field is left from non-implanted first hard mask layer 1 since this region was covered by the second resist 32. Left and right of that region are non-implanted regions 2 of the second hard mask layer 2.

Above and below the central field of the non-implanted hard mask layer 1 are regions 1' of implanted first hard mask layer 1. These regions 1' are implanted since those parts of the first hard mask layer 1 were not covered by the second resist 32.

In the corners of the section shown in FIG. 6A are four regions 2' of implanted second hard mask layer 2.

Given this example, the method has produced a regular orthogonal pattern in FIG. 6A with nine squares, each having one of four different etch selectivities, here defined by the implantation state.

The states of different etch selectivities can be described as a double bit binary pattern, i.e., the state of each region 1, 1', 2, 2' in FIG. 6A can be described by the combination of two bits, as indicated at the periphery of FIG. 6A. The bits along the vertical side of FIG. 6A indicate the etch selectivity state of the first hard mask layer 1, the bits along the horizontal side of FIG. 6A indicate the etch selectivity state of the second hard mask layer 2.

The double bit pattern is represented in the following truth table as known from Boolean algebra:

| Layer | implanted | non-implanted |
| --- | --- | --- |
| First hard mask layer 1 | In FIG. 6A: 1' | In FIG. 6A: 1 |
| Second hard mask layer 2 | In FIG. 6A: 2' | In FIG. 6A: 2 |

In a more abstract way, this implantation pattern can be represented by the following truth table giving certain logical values to the implantation states:

| Layer | implanted | non-implanted |
| --- | --- | --- |
| First hard mask layer 1 | 1 | 0 |
| Second hard mask layer 2 | 1 | 0 |

This distribution of logical values of implantation states is just one example. It is also possible to use an inverted set of states:

| Layer | implanted | non-implanted |
| --- | --- | --- |
| First hard mask layer 1 | 1 | 0 |
| Second hard mask layer 2 | 0 | 1 |

Or another possibility:

| Layer | implanted | non-implanted |
| --- | --- | --- |
| First hard mask layer 1 | 0 | 1 |
| Second hard mask layer 2 | 1 | 0 |

Depending on the states of the implantation states, represented here by different Boolean variables, the further processing steps (using different etch selectivities) can be chosen, as will be described below.

In the present example, the state "implanted" for the first hard mask layer 1 means "etchable." The second hard mask layer 2 behaves in an inverted way, i.e. the "implanted" state means that the second hard mask layer 2 becomes "non-etchable."

The logical table for etch selectivity state is therefore given the first variation of the truth table given above:

| Layer | etchable | non-etchable |
| --- | --- | --- |
| First hard mask layer 1 | 1 | 0 |
| Second hard mask layer 2 | 0 | 1 |

In the following, an embodiment is shown in which the substrate 10 is structured depending on the etch selectivity states, etch selectivity states being logically linked by the logical connection XOR (exclusive OR).

The person skilled in the art will recognize that other pairings of states are also possible.

The truth table of XOR for variables a, b is:

|  | Value of XOR |
| --- | --- |
| a, b = 0, 0 | 0 |
| a, b = 0, 1 | 1 |
| a, b = 1, 0 | 1 |
| a, b = 1, 1 | 0 |

The value for XOR is only TRUE if the values for a and b are not identical. The variables a, b would be the Boolean values indicated at the sides of the FIG. 6A.

Applied to the example of the embodiment given in FIGS. 6, 6A, the further structuring depending on a XOR connection can mean that, e.g., all regions, for which the XOR value is TRUE will be transferred into the substrate 10.

As indicated by the Boolean values in FIG. 6A, the XOR value is TRUE in the regular pattern for those regions 1', 2 in which the first hard mask layer 1 is implanted and the second hard mask layer 2 is not implanted. And the XOR value is also TRUE in regions 2', 1 in which the second hard mask layer 2 is implanted, but the first hard mask layer 1 is not implanted.

The XOR value is FALSE in the regular pattern in those regions 1', 2' in which the first and the second hard mask layers 1, 2 are implanted and in regions 1, 2 that the first and second hard marks layers 1, 2 are not implanted.

In the described embodiment, the patterning of mask layers can be used to mark certain regions distinctly by the combination of the bit pattern and make the further processing of the layers 1, 2, and eventually the substrate 10, dependent of the state of the regions 1, 2, 1', 2'.

After generating a pattern of non-implanted and implanted regions 1, 2, 1', 2' in the first and second mask layers, the XOR relationship can be used to transfer the pattern into the substrate 10 as will be explained in an example.

Figure 7:
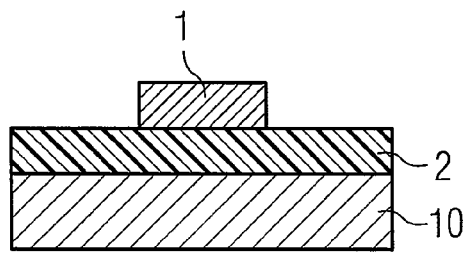
Figure 7A:
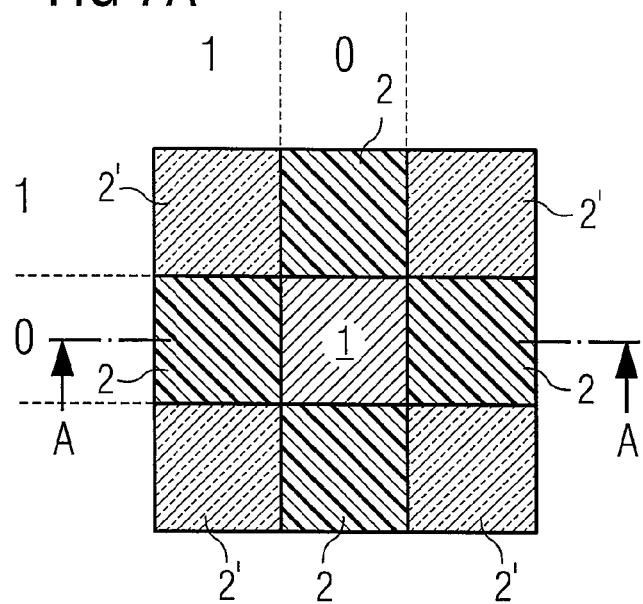

In FIGS. 7, 7A, the stack of FIGS. 6, 6A is shown after the $Al_2O_3$ layer of the first hard mask layer 1 damaged by the implantation is stripped with a hot standard clean 1. This removes the regions 1'. This represents the structuring using the first combination with a XOR value that is TRUE.

After this step, there is one region 1 in the center which is from non-implanted material of the first layer. This region 1 is surrounded by regions 2, 2' from the second hard mask layer. The regions 2 at the cardinal points are non-implanted, the regions 2' at the corners are implanted, i.e., all regions have different etch selectivities.

An anneal step might be used to stabilize the remaining $Al_2O_3$, i.e., the undamaged region 1 in the center of the pattern shown in FIG. 7A.

Figure 8:
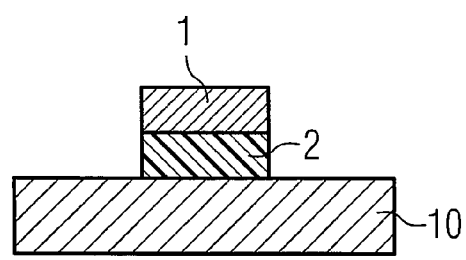
Figure 8A:
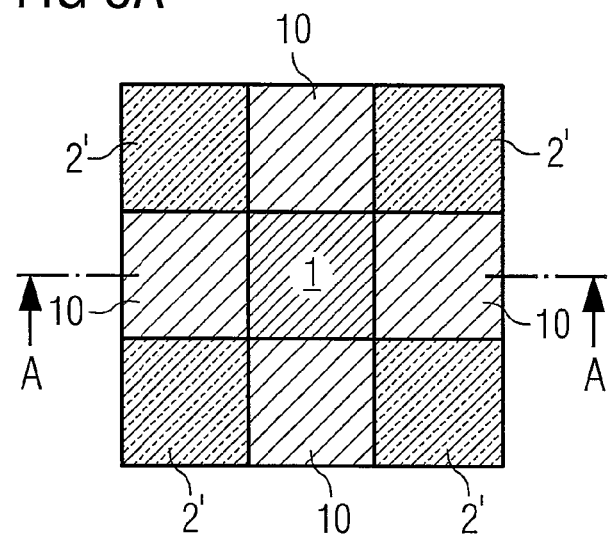

In FIGS. 8, 8A, the stack of FIGS. 7, 7A is shown after a dry etching (isotropic or anisotropic) of the non-implanted polysilicon, i.e., the regions 2 in FIG. 8A. The etching is effected by a $HBr/Cl/HeO_2$ mixture at a partial pressure of approximately 100:5:5 at plasma densities of approximately 0.5 $W/cm^2$ or an $Ar/SF_6$ mixture at process pressure in the range from 10 to 60 mTorr at a plasma density of approximately 1 $W/cm^2$ with substrate bias of 0 to 0.2 $W/cm^2$. The person skilled in the art will recognize that these process conditions are given here just as an example. Other process conditions might be applied for other materials or other purposes.

This represents the structuring using the second combination with a XOR value TRUE.

In FIG. 8A, it can be seen that a checkerboard mask has been generated in which the substrate 10 is only covered by remaining implanted regions 2' of the second hard mask layer 2 and the non-implanted region 1 of the first hard mask layer 1. Given this mask pattern, the substrate 10 can be patterned with a regular hole pattern.

It is understood that this hole pattern can be much larger than the situation shown in FIG. 8A.

In this embodiment, the dedicated alteration of the etch selectivities into different states has been used in connection with a logical XOR connection.

This method is not limited to the use with a regular orthogonal pattern but can be also used in other mask patterns in which logical values of TRUE and FALSE can be assigned to different regions in two mask layer.

Furthermore, the method is not limited to the use of the XOR relationship.

If logical values of TRUE and FALSE can be assigned to mask regions, the method can also be used to realize a NAND or NOR logical connection.

The NAND connection is only FALSE if all input values are TRUE. The NOR connection is only TRUE if all input values are FALSE.

Furthermore it is possible that inversions of the above mentioned Boolean expressions are used.

The truth table of the inverted XOR Boolean XNOR relationship is:

0 XNOR 0=1
0 XNOR 1=0
1 XNOR 0=0
1 XNOR 1=1

This pattern is reached if one "unit cell" of the regular pattern, i.e., the elementary structural element is shifted one F (i.e., on unit of structural width) in the x- or y-direction.

The person skilled in the art will recognize that those logical relationships can be "programmed" using different etch selectivities by altering the states of the two hard mask layers 1, 2 as shown in the figures above.

For the sake of simplicity, only two mask layers 1, 2 were used in the embodiment described above. In case more than two mask layers 1, 2 are used, more complex structures can be produced. This would result in more complex bit patterns. In case three mask layers are used, a 3×3 bit pattern would be used which could result in a more complex structuring. Furthermore, it would be possible to use more complex logical expressions, i.e., a combination of two or more Boolean operations to obtain a complex structure.

The person skilled in the art will recognize that the materials of the hard mask layers 1, 2 are just examples. In principle, it is possible to used resist layers and combination of resist and hard mask layers. In case different resist are used, the resist might be sensitive to different wavelengths, so that the etch selectivity might be altered by exposing the resist layers to light with different wave lengths.

Figure 9:
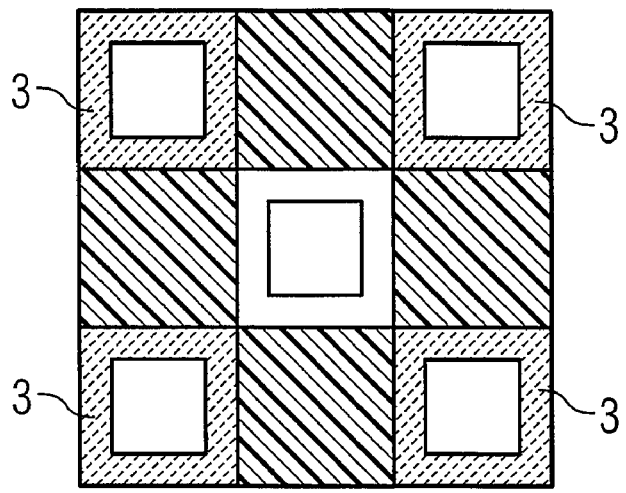
FIG. 9 illustrates a further embodiment that may be used in connection with one of the embodiments of FIGS. 1-8A.

In FIG. 9, a further possibility is shown which might be used in connection with one of the embodiments described above. A third layer 3 might be introduced, e.g., before the etching of the holes with the hard mask depicted in FIG. 9. The third hard mask would then be structured to provide a rim structure for the open substrate 10 regions. This would ensure that the hole to be etched into the substrate 10 would not be close to the adjacent regions, thereby ensuring a better electrical separation.

Figure 10:
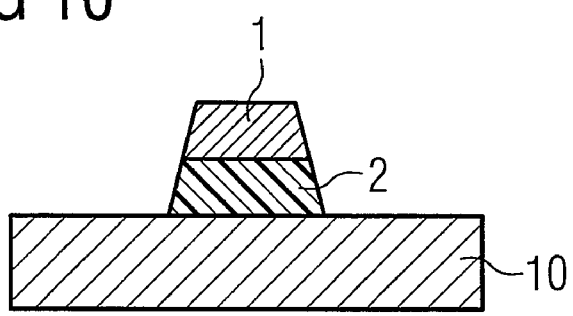
FIG. 10 illustrates an embodiment with a hard mask having tapered walls.

Alternatively the hard mask in FIG. 8 might have tapered walls, which is depicted in FIG. 10. Those slanted walls would have also the effect of separating holes efficiently.

Figure 11:
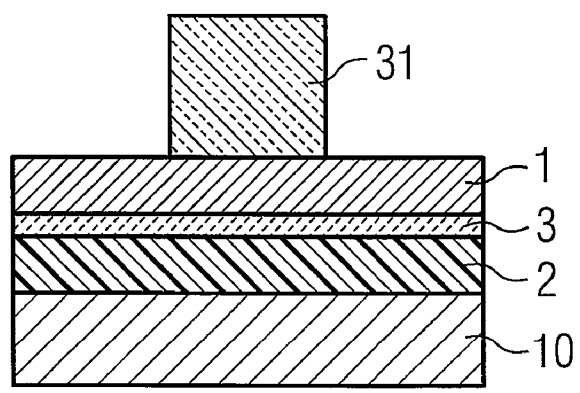
FIG. 11 illustrates an alternate embodiment of the present invention.

In an alternative embodiment, an intermediate layer 3 can be positioned between two of the hard mask layers 1, 2 which are, e.g., shown in FIG. 1. This intermediate layer 3 is depicted in FIG. 11. The purpose of the intermediate layer 3 can be the catching of straggling particles. The intermediate layer 3 can comprise SiN and/or $SiO_2$. The thickness can be 5 to 10 nm.

The person skilled in the art will recognize that the materials and/or dimensions of the intermediate layer 3 are exemplary only.

After the selective removal of the first hard mask layer 1 by a principally known dry etching process, the intermediate layer 3 is opened selectively to the surface hard mask. This can take place before or after the stripping of the photoresist layer 31. The process would then continue as shown, e.g., in FIG. 3 and the following figures.

Above the etch selectivity between different materials has been used as an example of a material property which is modified.

In another embodiment, the surface of one material could be modified so that a deposition of another material is only possible in the regions of the surface that have been modified. In an example, a deposition of material could only take place in regions in which a certain electrical conductivity is created. A first lithography would create, e.g., an n-doped region (e.g., strips) on a generally undoped substrate. A second lithography (e.g., orthogonally to the strips created by the first lithography step) using a dopant of the opposite charge and the same dose would be used. The second doping would result in resetting the state of the material property to the previously doped regions. Using this embodiment, an analogue pattern as depicted. e.g., in FIG. 7A can be reached, i.e., four different states of a material property that can then be used for further processing, e.g., using a Boolean operation as, e.g., XOR.

Further embodiments of the current invention are depicted in FIGS. 12 to 29.

For the first variation of an embodiment, shown in FIGS. 12 to 17, the initial stack is depicted in FIG. 12 in the form of a cross section. FIG. 12A shows the same stack from a top view.

The stack comprises a substrate 10 with a second hard mask layer 2 on top and a first hard mask layer 1 on top of the second hard mask layer 2. On the first hard mask layer 1, a structured resist 31 is shown. Underneath the substrate 10 is another layer 12.

In an embodiment that is similar to the one shown in FIG. 12, the substrate 10 can comprise SiON, $SiO_2$, C, Si—N and/or Ge compound.

The second hard mask layer 2 can comprise undoped a-silicon.

The first hard mask layer 1 can comprise SiON, $SiO_2$, Si—N, C and/or $Al_2O_3$.

The resist 31 can be a photoresist or multilayer resist system, which optionally comprises silicon.

The another layer 12 can be, e.g., a carbon layer.

In another embodiment that is analog to FIG. 13, the substrate 10 has a thickness of 30 nm, the second hard mask layer 2 has a thickness of 20 nm, and the first hard mask layer 1 has a thickness of 20 nm.

In FIGS. 13, 13B, cross sections of the stack according to FIG. 12 after several process steps is depicted. The locations of the cross sections A-A (FIG. 13B), B-B (FIG. 13) are indicated in FIG. 13A.

The first lithography step can comprise a line/space pattern that can be performed perpendicular or tilted to the first pattern.

After a first lithography step, the first hard mask layer 1 has been etched, e.g., by an anisotropic dry etch with a halogen standard chemistry (e.g., fluorine based). Here, no implant step or $Al_2O_3$ etch is necessary. After the etching, the resist is stripped and the surface is cleaned.

After that, a second lithography step, using a second resist 32, is performed so that structures obtained in this example are orthogonal to the result of the first lithography step. The second resist 32 can be a single layer resist, a bilayer resist, or a trilayer resist.

In FIGS. 14, 14B, different cross sections A-A (FIG. 14), B-B (FIG. 14B) (see FIG. 14A) are depicted showing the result of further process steps.

The stack is further processed with an irradiation, i.e., here a vertical implantation. The implantation can be, e.g., a $BF_2$, an oxygen, or an argon implantation.

The regions covered by the second resist 32 (i.e., in the horizontal middle of FIGS. 13A, 13B), the second hard mask layer 2, and the remaining portion of the first hard mask layer 1 are not implanted. The regions not covered by the second resist 32 are implanted 2'.

In FIG. 14A, the situation is shown after the first hard mask layer 1 is in some regions removed by an etch process.

In some other regions (see FIG. 14), the first hard mask layer 1 remains.

In FIG. 15 (cross section A-A), 15B (cross section B-B), different cross sections (see FIG. 15A) are depicted showing the result of further process steps.

The non-implanted material (e.g., poly-silicon) of the second hard mask layer 2 (here poly-silicon) is selectively etched to the first hard mask layer 1 (here SiON) and the implanted silicon. The etching can be performed by a $HeO_2$/HBr chemistry.

As can be seen in FIG. 15A, an analog pattern like, e.g., in FIG. 6A, is manufactured with two lithography steps and one irradiation step.

In FIG. 16, the result of a following process step is shown with an additional substrate layer 12. In one possible embodiment, this can be made from carbon.

The pattern, which is shown in FIGS. 15, 15A, 15B, is transferred into the layers below by an etching process step. In the example shown in FIGS. 16, 16A, 16B, the pattern is transferred into the substrate 10. In one possible embodiment, a SiON layer. The etching removes the SiON material on the top. If etching is performed with a bias, the holes are made smaller, which is indicated by the tapered wall structures.

In FIGS. 17, 17A and 17B, the transfer of this pattern into a carbon layer 10A is depicted. The remaining SiON and the a-Si will be removed in subsequent process steps.

In FIGS. 18 to 23, another embodiment is depicted.

The stack (see cross section in FIG. 18, top view in FIG. 18A) used in this exemplary embodiment differs from the previous stacks since the substrate 10 comprises two layers 11, 12. The first substrate layer 11 can be, e.g., a $SiO_2$ layer with, e.g., a carbon layer 12 underneath.

On top of the first substrate layer 11 is a second hard mask layer 2 and on top of that a first hard mask layer 1.

The first hard mask layer 1 can comprise, e.g., SiN, SiON or carbon.

The second hard mask layer 2 can comprise, e.g., a-silicon.

On top of that, a structured first resist layer 31 is positioned at least in parts of the first hard mask layer 1 (see FIG. 18A). The stack shown in FIG. 18 forms the starting point for the embodiment.

In another embodiment that is analog to FIG. 18, the substrate layers 11, 12 have a thickness of 20 nm, the second hard mask layer 2 has a thickness of 10 nm and the first hard mask layer 1 has a thickness of 20 nm.

The stack is subjected to a first lithography process step.

In FIGS. 19, 19B, cross sections of the stack after some process steps are depicted. The locations of the cross sections A-A, B-B is indicated in FIG. 19A.

After a first lithography step, the first hard mask layer 1 has been etched, e.g., by an anisotropic dry etch with a halogen standard chemistry (e.g., fluorine based). Here no implant step or $Al_2O_3$ etch is necessary. After the etching, the resist is stripped and the surface is cleaned.

After that, a second lithography step, using a second resist 32, is performed so that structures obtained in this example are orthogonal to the result of the first lithography step. The second resist 32 can be a bilayer resist or a trilayer resist.

In FIGS. 20, 20B, different cross sections A-A, B-B (see FIG. 20A) are depicted showing the result of further process steps.

The stack is further processed with an irradiation, i.e., here a vertical implantation. The implantation can be, e.g., a $BF_2$, an oxygen or an argon implantation, or a mixture with at least one of these gases.

The regions covered by the second resist 32 (i.e., in the horizontal middle of FIG. 20A), the second hard mask layer 2, and the remaining portion of the first hard mask layer 1 are not implanted. The regions not covered by the second resist 32 are implanted.

In FIG. 20B, the situation is shown after the first hard mask layer 1 is in some regions removed by an etch process, in some regions (see FIG. 20) the first hard mask layer 1 remains.

In FIGS. 21, 21A and 21B, the situation is shown after the second resist 32 has been stripped. In FIG. 21A it is shown that in the four cardinal directions, the surface is formed by the first substrate layer 11, the corners are covered by the second hard mask layer 2, the center by the first hard mask layer 1.

After the resist strip, the stack is subjected to an isotropic wet etch. In the example, the a-silicon of the second hard mask layer 1 is etched isotropically, thereby underetching (see FIG. 21) the first hard mask layer 1 above (here, e.g., SiN or carbon). One possible etch chemistry to achieve this is the SC1 chemistry.

In FIGS. 22, 22A and 22B, it is shown that the pattern is transferred with, e.g., a dry etch into the first substrate layer 11, here a carbon layer. Alternatively, a $SiO_2$ layer can be used. The a-silicon layer 2 is working as a hard mask. The SiON (or carbon) layer is positioned above the a-silicon layer 2. With this configuration, the $SiO_2$ layer 11 underneath can be etched, as well as carbon.

Looking at FIG. 22A, it can be seen that the implanted a-silicon 2' in the corners work as hard masks. In the center, the remains of the first hard mask layer 1 covers the non-implanted a-silicon 2. Using this stack, an etching can be performed. Which etch can be performed can depend on the material selected, i.e., the choices here are examples. If, e.g., $SiO_2$ should be present in the substrate 11, no $SiO_2$ should be present in the central region above. If $SiO_2$ is present above, then carbon is possible below. The implanted a-silicon is possible in both cases.

In FIGS. 23, 23A and 23B, the further transfer into the underlayer 12 is shown.

In FIGS. 24 to 29, another embodiment is shown. This embodiment has only one hard mask layer 1 (e.g., comprising undoped a-silicon), as can be seen in the cross section of FIG. 24. In one embodiment, this first hard mask layer 1 can be a-silicon.

The substrate 10 can comprise, e.g., SiON, $SiO_2$, SiN, and/or carbon. Underneath the substrate 10, another layer, e.g., a carbon layer 12, is positioned Above the first hard mask layer 1, a structured resist is positioned. The resist 31 can comprise silicon.

This stack is the starting point for the embodiment shown in FIGS. 24 to 29.

The stack is subjected to a first lithography process step.

In FIGS. 25, 25B, cross sections of the stack after some process steps are depicted. The locations of the cross sections are indicated in FIG. 25A.

After a first lithography step, the first hard mask layer 1 has been etched, e.g., by an anisotropic dry etch with a halogen standard chemistry (e.g., fluorine based). Here, no implant step or $Al_2O_3$ etch is necessary. After the etching, the resist is stripped and the surface is cleaned.

It should be noted that under the resist layer 31, a BARC layer (Bottom Anti-Reflex Coating) can be positioned.

After that, a second lithography step, using a second resist 32, is performed so that structures obtained in this example are orthogonal to the result of the first lithography step. The resist can be a bilayer resist or a trilayer resist.

In FIGS. 26, 26A, 26B, the situation after another process step, is depicted. FIGS. 26, 26B show cross sections A-A, B-B as indicated in FIG. 26A. The stack of the previous process step has been subjected to an implantation, e.g., with $BF_2$ or O/Ar. Therefore, the properties of the four corner fields 1' in FIG. 26 have been altered.

In FIGS. 27, 27A, 27B, the situation after resist overetch is shown, so that only the area with a double resist layer (see FIG. 27A) remains covered by a resist.

As in the previous figures, the positions of the cross sections of FIGS. 27, 27B are indicated in FIG. 27A.

In FIGS. 28, 28A, 28B, the situation after a further process step is shown, FIGS. 28, 28B being cross-sections indicated in FIG. 28A. The first hard mask layer 1, an, e.g., a-silicon is removed by wet etch from all parts except the central part covered by the resist layer 31.

In FIGS. 29, 29A, 29B, the situation after a further process step is shown, FIGS. 29, 29B being cross-sections indicated in FIG. 29A. The substrate 10 has been anisotropically etched so that a tapered structure (see FIG. 29) is formed. Like in the previously described embodiment, the taper allows little or even no contact between the regions shown, e.g., in FIG. 29A.

In another embodiment, an optical property can be the modified material property. Optical properties can be changed, e.g., by ion implantation.

Other material properties could be chemical properties, reflectiveness, or transmissivity of layers.

In the examples given above, the material property state of a layer is modified using ion implantation. This is one example of a modifying process step. Another example can be an implantation or irradiation using high-energy uncharged particles. Such particles can be produced by hollow cathode magnetrons or nuclear sources. The ions produced thereby are neutralized after the acceleration. Uncharged particles can also be photons such as in X-ray or other electromagnetic radiation.

In principle, other atomic species might be used for implantation or irradiation. Especially inert gases, like helium, argon or xenon might be used.

The effect of the alteration of the material property can be due to various factors. It can be, e.g., due to an implantation of a dopant into poly-silicon that alters the etchability against $NH_4OH$. In the case of $Al_2O_3$, the crystal structure is, e.g., altered resulting in the breaking of chemical bonds. This in turn allows for an etching using SC1. In another example, the implantation of oxygen into poly-silicon results in the formation of $SiO_x$ that alters the chemical and/or physical properties. The person skilled in the art will recognize that other effects might be reached in different systems.

What is claimed is:

1. A method of forming a structure on a substrate, the method comprising:

forming at least a first mask layer and at least a second mask layer, with the first mask layer at least partially covering the second mask layer;

modifying a material property in regions of the first mask layer and modifying a material property in regions of the second mask layer so that each mask layer comprises a set of material property states representing the regions of the respective mask layer by binary variables;

removing at least parts of the first mask layer and the second mask layer depending on the material property states in the mask layers; and structuring the substrate depending on the material property states of the first and second mask layers, the material property states being determined by a logical link with at least one of the Boolean operators XOR, NAND and NOR or an inverted Boolean operator thereof operating on the respective binary variables in the sets of the material property states.

2. The method according to claim 1, wherein a layer or the substrate is structured in regions where a result of a Boolean expression yields TRUE and not structured in regions where the result of the Boolean expression yields FALSE.

3. The method according to claim 1, wherein a layer or the substrate is structured in regions where a result of a Boolean expression yields FALSE and not structured in regions where the result of the Boolean expression yields TRUE.

4. The method according to claim 1, wherein modifying the material property of at least one of the first and second mask layers comprises modifying by irradiation of photons.

5. The method according to claim 1, wherein modifying the material property state of at least one of the first and second mask layers comprises modifying by a particle stream.

6. The method according to claim 1, wherein the substrate is at least partially a pre-structured wafer.

7. The method according to claim 1, wherein after removing at least parts of the first mask layer and after removing at least parts of the second mask layer depending on the material property states in the mask layers, a regular pattern of regions with different material properties is obtained.

8. The method according to claim 1, wherein structuring the substrate comprises structuring a regular hole pattern in the substrate depending on the material property states of the mask layers.

9. The method according to claim 1, wherein a stack of the first mask layer and the second mask layer comprises at least one tapered structure.

10. The method according to claim 1, wherein at least one of the mask layers comprises a resist.

11. The method according to claim 1, wherein the substrate comprises at least one material selected from the group consisting of silicon, germanium, III-V semiconductor material, plastic, and glass.

12. The method according to claim 1, wherein at least one intermediate layer is positioned between the two hard mask layers.

13. The method according to claim 1, wherein the material property is at least one of etch selectivity, electrical conductivity, concentration of dopant, optical property, chemical property, physical property, reflectiveness, and transmissivity.

14. The method according to claim 1, further comprising performing additional steps to fabricate a semiconductor device.

15. The method according to claim 1, wherein at least one of the mask layers is a hard mask layer.

16. The method according to claim 15, wherein at least one hard mask layer comprises $Al_2O_3$, SiN, SiON, $SiO_2$, silicon, poly-silicon, amorphous silicon or carbon.

17. The method according to claim 1, wherein modifying the material property state of at least one of the first and second mask layers comprises modifying by ion implantation or uncharged particle implantation or irradiation.

18. The method according to claim 17, wherein modifying the material property state of at least one of the first and second mask layers comprises modifying by ion implantation using at least one material selected from the group consisting of argon, xenon, fluorine, hydrogen atoms and ions.

19. The method according to claim 1, wherein at least one of the first mask layer and the second mask layer comprises lines in a line pattern.

20. The method according to claim 19, wherein the lines intersect at least partially.

21. The method according to claim 20, wherein the lines at least partially form an orthogonal or regular grid.

22. The method according to claim 21, wherein the orthogonal grid comprises strips in the mask layers.

23. A method of forming an integrated circuit, the method comprising:

forming a first mask layer and a second mask layer, with the first mask layer at least partially covering the second mask layer;

modifying a material property in regions of the first mask layer and modifying a material property in regions of the second mask layer so that each mask layer comprises a set of material property states representing the regions of the first and second mask layers by binary variables;

removing at least parts of the first mask layer and the second mask layer depending on the material property states in the first and second mask layers; and structuring a substrate depending on the material property states of the first and second mask layers, the material property states being determined by a logical link with at least by one of the Boolean operators XOR, NAND and NOR or an inverted Boolean operator thereof operating on the respective binary variables in the sets of the material property states.

* * * * *